United States Patent [19]

Zirinsky et al.

[11] 3,974,003

[45] Aug. 10, 1976

[54] CHEMICAL VAPOR DEPOSITION OF DIELECTRIC FILMS CONTAINING Al, N, AND Si

[75] Inventors: Stanley Zirinsky, Dobbs Ferry; Eugene A. Irene, Wappingers Falls; Victor J. Silvestri, Mount Kisco, all of N.Y.

[73] Assignee: IBM, Armonk, N.Y.

[22] Filed: Aug. 25, 1975

[21] Appl. No.: 607,420

[52] U.S. Cl. .............................. 148/187; 148/1.5; 357/23; 357/41; 357/54; 423/324; 423/351; 427/82; 427/93; 427/94; 427/95; 427/126; 427/248
[51] Int. Cl.² ................ H01L 21/318; H01L 29/78
[58] Field of Search ............... 148/1.5, 187; 427/82, 427/93, 94, 95, 126, 248 A, 248 B, 248 I; 357/23, 41, 54; 423/324, 351

[56] References Cited
UNITED STATES PATENTS

| | | | |
|---|---|---|---|
| 3,306,768 | 2/1967 | Peterson | 427/93 X |
| 3,373,051 | 3/1968 | Chu et al. | 357/54 X |
| 3,475,234 | 10/1969 | Kerwin et al. | 148/187 |
| 3,485,666 | 12/1969 | Sterling et al. | 427/93 X |
| 3,540,926 | 11/1970 | Rairden | 427/248 X |
| 3,549,411 | 12/1970 | Bean et al. | 357/54 X |
| 3,600,218 | 8/1971 | Pennebaker | 357/54 X |
| 3,895,390 | 7/1975 | Meiling et al. | 148/1.5 X |

OTHER PUBLICATIONS

Silvestri et al., "Chemical Vapor Deposition of $Al_xO_yN_z$ Films" J. Electronic materials, vol. 4, No. 3, 1975, pp. 429-443.
Sterling et al., "Deposition of Insulating Coatings . . . . . ." Chemical Abstracts, vol. 70, 1969, p. 355.

*Primary Examiner*—R. Dean
*Assistant Examiner*—W. G. Saba
*Attorney, Agent, or Firm*—Pollock, Vande Sande & Priddy

[57] ABSTRACT

Method for depositing a layer containing Al, N, and Si on a substrate which comprises providing a substrate to be coated, a carrier gas, and a gaseous mixture of nitrogen source compounds, aluminum source compounds and silicon source material and heating the substrate to a temperature in the range of about 500° to about 1,300° C to thereby cause formation on the substrate of a layer containing Al, N, and Si; and products obtained by the method.

38 Claims, 3 Drawing Figures

CHEMICAL VAPOR DEPOSITION OF DIELECTRIC FILMS CONTAINING AL, N, AND SI

BACKGROUND OF THE INVENTION

The present invention is directed to depositing a layer containing Al, N, and Si upon a substrate by chemical vapor deposition and articles obtained thereby. Moreover, the present invention is directed to preparing semiconductor devices such as MISFET devices including MOSFET and MIOSFET devices containing a layer comprising Al, N, and Si deposited upon a semiconductor substrate.

The materials which are presently utilized commercially for MOS (metal-oxide-semiconductor) and MIOS (metal-insulator-oxide-semiconductor) charge storage devices operated as field effect transistors within memory systems include silicon nitride ($Si_3N_4$) or aluminum oxide ($Al_2O_3$) for the charge storage layers as exemplified by D. Frohman et al, Proceedings IEEE, Vol. 58, No. 8, August 1970; M. White et al, IEEE Transactions, Electrochemical Division, Vol. ED-19, No. 12, December 1972; C. Nabor et al, Semiconductor Silicon, 1973 Edition, Electrochemical Society, Princeton, New Jersey; C. Salama, Journal Electrochemical Society, Vol. 117, No. 7, p. 913 (July 1970); and Balk et al, Journal Electrochemical Society, Vol. 118, p. 1634 (1971).

The above insulating materials have been widely used since they possess various favorable electrical properties which are required for acceptable charge storage devices such as large forbidden conduction band gaps, high dielectric constant, high DC resistance and breakdown voltage, and availability of energy traps within the forbidden band gap for charge storage. These electrical properties are important for such devices as read only or read mostly memories which require the ability to retain charges for relatively long periods of time such as several years and be electrically alterable with practical voltage pulse levels which are consistent with current computer electrical power systems.

However, the use of $Si_3N_4$ and $Al_2O_3$ has been somewhat restricted due to problems associated with the erasure of previously injected charges by reverse biasing. Although $Al_2O_3$ can be electrically "written" at relatively low voltages such as from about 15 to about 25 v., erasure to the original state requires voltage pulses up to about 35 v. The application of large numbers of write and erase (charging and discharging) pulse cycles due to the high erasure voltage tends to result in early device failure. Additionally, $Si_3N_4$ requires voltage pulses above 25 v. for both write and erase to obtain useful charge windows.

Accordingly, it is an object of the present invention to provide a method which makes it possible to prepare semiconductor devices which have improved ease of erasure properties for use as electrically alterable write-erase voltage window.

In addition, it is an object of the present invention to provide a method whereby it is possible to obtain semiconductor devices which possess reduced voltage requirements for maintaining stable memory voltage window.

Another property necessary for long term memory utilization is the capability of the particular device to retain the charge state previously written for the desired long period of time which is usually several years. It has been established both experimentally and theoretically that the written charge state constantly leaks its electrical charge at rates determined by the silicon oxide thickness, the amount of charge injected into the charge storage layer, and the particular electronic properties of the charge storage layer established by the chemical composition of the charge storage layer materials. For instance, see S. Zirinsky, "Charge Transfer Properties of MNOS Structures as Influenced by Processing Parameters", AIME, Electronic Materials Division Meeting, Boston, Massachusetts, Paper No. C3, September 1974, Journal of Electronic Materials, Plenum Press, New York, June 1975, Vol. 4, No. 3, p. 591, and L. Lundkvist et al, Solid State Electronics, Vol. 16, p. 811 (1973).

One method for designating the memory retention behavior of a particular device is the specification of rate of charge loss per decade of time (volts per decade of time) after initial charging to a specified charge level (volts initial). Both $Al_2O_3$ and $Si_3N_4$ show a linear loss rate per decade of time with the charge loss generally starting at approximately one millisecond following application of the writing pulse.

When writing initially to the range of +4 to +5 volts for the initial charge level, the charge level would discharge at a rate between 0.25 to 0.35 volts per decade of time. After periods between 1 and 10 years (10 to 11 decades of time), the final charge level will range between 1 and 1.5 volts, which is not considered acceptable for memory design considerations. Writing to higher charge levels does not solve this problem since larger charge loss rates are observed eventually yielding the same charge level for the period of time as obtained above. Lower charge loss rates can only be obtained with relative thickening of the oxide layer. However, this in turn necessitates the use of excessively high writing voltages that cause early multiple cycling device failure.

Accordingly, it is an object of the present invention to provide a method whereby the final charge level can be increased as compared to the values observed for the $Si_3N_4$ or $Al_2O_3$ layers.

A further object of the present invention is to provide a method whereby the composition of the film deposited on the substrate can be selectively controlled so that the desirable properties discussed hereinabove can be achieved. A further object of the present invention is to provide a method and article obtained thereby wherein the composition of the film is predictable and reproducible.

SUMMARY OF THE INVENTION

One aspect of the present invention is a method for depositing a layer containing Al, N, and Si on a substrate by chemical vapor decomposition which comprises:
A. providing in a reaction zone, a substrate to be coated, a carrier gas, and a reactive gaseous mixture of:
1. nitrogen compound capable of providing reactive gaseous nitrogen at the conditions in said reaction zone;
2. aluminum compound capable of providing reactive gaseous aluminum at the conditions in said reaction zone; and
3. a silicon compound capable of providing reactive gaseous silicon at the conditions in said reaction zone;

B. heating the substrate in said reaction zone to a temperature in the range of about 500° to about 1,300° C to cause formation on said substrate of the layer containing Al, N, and Si wherein the atomic percent of N in said layer is from about 50 to about 57%, the atomic percent of Al is from about 30 to about 5%, and the atomic percent of Si is from about 20 to about 40%, said atomic percents being based upon the total atoms of Al, N, and Si in the layer.

Another aspect of the present invention is a method for fabricating a semiconductor device which comprises:
A. providing a semiconductor substrate of a first conductive type containing an active impurity of a first type in a reaction zone, a carrier gas, and a reactive gaseous mixture comprising:
 1. a nitrogen compound capable of providing reactive gaseous nitrogen at the conditions in said reaction zone;
 2. aluminum compound capable of providing reactive gaseous aluminum at the conditions in said reaction zone;
 3. a silicon compound capable of providing reactive gaseous silicon at the conditions in said reaction zone;
B. heating the substrate in the reaction zone to a temperature in the range of about 500° to about 1,300° C to thereby cause formation on the substrate of a layer containing Al, N, and Si wherein the atomic percent of N in the layer is from about 50 to about 57%, the atomic percent of Al is from about 30 to about 5% and the atomic percent of Si is from about 20 to about 40%, the atomic percents being based upon the total atoms of N, Al, and Si in the layer;
C. incorporating an active impurity of a second type into preselected regions of the substrate;
D. removing material at preselected locations of the insulating layer to provide for ohmic electrical contact between preselected regions of the underlying semiconductor substrate and subsequently applied electrical contacts; and
E. then depositing a plurality of electrical contacts at preselected locations wherein a predetermined number of the contacts are in ohmic electrical contact with the preselected regions of the underlying semiconductor substrate so as to provide the semiconductor device.

The present invention is also concerned with devices obtained by the above-described processes. Another aspect of the present invention is a device which contains a substrate having a chemical vapor deposited layer containing Al, N, and Si thereon wherein the atomic percent of N in said film is from about 50 to about 57%, the atomic percent of Al is from about 30 to about 5%, and the atomic percent of Si is from about 20 to about 40%, the atomic percents being based upon the total atoms of N, Al, and Si in the layer. Another aspect of the present invention is a semiconductor device which comprises:
A. a semiconductor substrate of a first conductive type containing an impurity of a first type and containing an active impurity of a second type in preselected regions thereof;
B. an insulating layer of chemical vapor deposited layer containing Al, N, and Si wherein the atomic percent of N in said layer is from about 50 to about 57%, the atomic percent of Al is from about 30 to about 5%, and the atomic percent of Si is from about 20 to about 40%, the atomic percents being based upon the total atoms of N, Al, and Si in the layer; and
C. a plurality of electrical contacts wherein a predetermined number of contacts are in ohmic electrical contact with preselected regions of the underlying semiconductor substrate.

DESCRIPTION OF PREFERRED EMBODIMENTS

Figure 1:
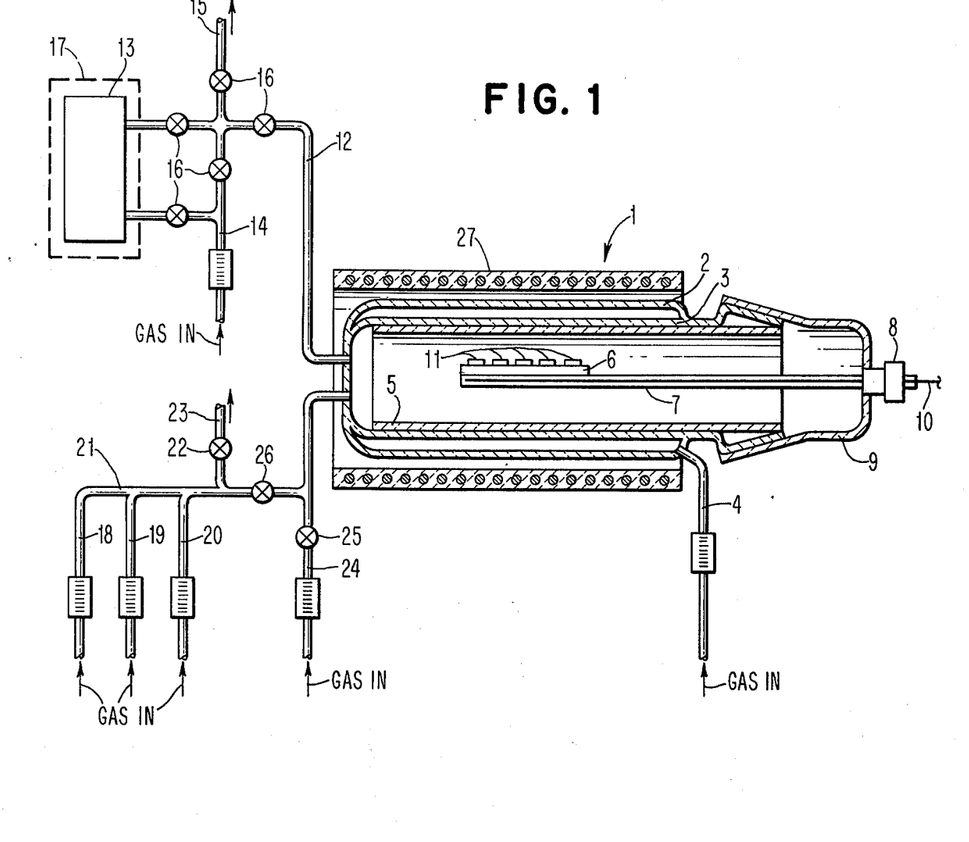
FIG. 1 is a schematic diagram demonstrating apparatus suitable for carrying out the process of the present invention.

FIG. 1 is a schematic representation of one chemical vapor deposition system suitable for carrying out the process of the present invention. In FIG. 1, numeral 1 represents the reaction tube which is heated by means of a three-zone resistance furnace 27 and consists of a double wall quartz tube represented by numerals 2 and 3. In the specific embodiment shown, the inner tube is about 40 inches in length and about 2 inches in diameter. A flow of nitrogen is maintained between the outer and inner wall of the quartz tube by means of conduit 4 to prevent devitrification of the reaction chamber wall and to prevent impurities from diffusing into the tube.

Numeral 5 represents a quartz liner tube which is readily changeable when needed. Numeral 6 represents a quartz substrate holder and numeral 7 represents a quartz well fused along the length of the quartz substrate holder. The quartz well acts as a supporting rod and can be slipped through Beckman fitting 8 attached to end cap 9 to provide flexibility in positioning of the substrate. Numeral 10 represents a Pt/Pt 10% Rh thermocouple which is located within the quartz well to monitor the temperature of the furnace in the central region wherein the substrates are to be located.

It is understood that other types of reaction zones can be employed. For instance, radio frequency induction or quartz iodine lamp heating can be used as well as the types of heating disclosed hereinabove. The particular type of reaction chamber is not critical to carrying out the steps of this invention.

Numeral 11 represents the substrates upon which the layer containing Al, N, and Si is to be deposited. Preferably the substrate is a semiconductor material. In particular, the substrate can be any of the known semiconductor substrates which contain a first conductive type containing an active doping impurity of a first type.

In discussing a semiconductor fabrication method which is the preferred application of the present process, the usual terminology that is well known in the transistor field will be used herein. In discussing concentration, references will be made to majority or minority carriers. By "carrier" is signified the free holes or electrons which are responsible for the passage of current through a semiconductor material. Majority carriers are used in reference to those carriers in the material under discussing, i.e., holes in P-type material or electrons in N-type material. By use of the terminology "minority carriers" it is intended to signify those carriers in the minority, i.e., holes in the N-type material or electrons in the P-type material. In the most common type of semiconductor materials used in present day transistor structure, carrier concentration is generally due to the concentration of the "significant impurity". That is, impurities which impart conductivity characteristics to extrinsic semiconductor material.

Unless otherwise specified, when reference is made to an impurity of a "first type" and to an impurity of a "second type", it is understood that the "first type" refers to an N or P-type material, and "second type" refers to the other material. That is, if the "first type" is P, then the "second type" is N. If the "first type" is N, then the "second type" is P. In referring to a region containing an impurity concentration of P-type, for instance, it is meant the "significant impurity" is a P-type and that the majority carrier are holes.

Suitable dielectric substrates include silicon, germanium, gallium arsenide, or other III-V, II-V or II-VI semiconductor material. The terms "dielectric substrate" and "semiconductor substrate" as used herein refer to dielectric or semiconductor material per se or layer of semiconductor material on a nonconductive or insulating backing. The thickness and conductivity of the substrate is not particularly critical and is dependent upon the particular application of the final product and is primarily determined by economical and practical considerations. For convenience, the substrate can be from about 1 to about 50 mils thick.

An example of a P-type impurity for silicon or germanium is boron. In addition, N-type impurities for silicon or germanium include arsenic and phosphorus. As exemplified in FIG. 1, a plurality of the substrates is employed. The substrates can be precleaned using a cleaning process of the type discussed by Kern et al, R.C.A. Review, 31, 187 (1970) and then loaded horizontally on the holder for a layer deposition run.

The aluminum compound capable of providing reactive gaseous aluminum at the conditions in the reaction zone is fed to the reaction chamber through line 12. The properties of the aluminum compound may require that line 12 be heated and inert. The aluminum compound is fed through line 12 to the reaction zone from a stainless steel or other inert container and evaporator 13. The aluminum compound can be any aluminum-containing compound provided it is capable or providing gaseous aluminum which is reactive with the other gaseous materials under the conditions present in the reaction zone. Mixtures of aluminum compounds can be used when desired. Examples of suitable aluminum compounds include aluminum halides such as aluminum chloride ($AlCl_3$), aluminum bromide ($AlBr_3$), and aluminum iodide; trialkyl aluminum compounds wherein the alkyl group is generally from 1 to about 6 carbon atoms such as trimethyl aluminum, triethyl aluminum, tri-n-propyl aluminum, and tri-n-butyl aluminum; and aluminum alkoxides such as those of the formula $Al(OR)_3$ wherein R is an alkyl group of 1 to about 6 carbon atoms and including aluminum isopropylate, aluminum n-butoxide, aluminum ethoxide, and alkyl aluminum halides and dialkyl aluminum halides wherein the alkyl group is generally from 1 to about 6 carbon atoms and including aluminum diethyl chloride. The preferred aluminum compounds are the aluminum halides of which aluminum chloride ($AlCl_3$) is most preferred.

A carrier gas for the aluminum compound is fed into the bottom of the evaporator via line 14. The gases for carrying the aluminum compound as well as for the nitrogen compound and silicon compound into the reaction zone is usually hydrogen, nitrogen, and the inert gases such as argon and helium. Mixtures of carrier gases can be used when desired. The preferred carrier gas is hydrogen or nitrogen with nitrogen being the most preferred. Numerals 16 represent valves which regulate the flow of the carrier gas and/or aluminum compound. The evaporator can be heated within the oven 17. Next the aluminum compound is conveyed to the reaction zone by means of heated conduits represented by numeral 12. The temperature in the lines can be maintained between about 100° and about 200° C and preferably between about 115° and about 150° C when using an aluminum halide. The line 15 represents a purge manifold to preset the aluminum compound flow prior to its introduction to the reaction zone.

Carrier gas, the nitrogen compound capable of providing reactive nitrogen and the silicon compound capable of providing reactive silicon are premixed in line 21 via lines 18, 19, and 20, respectively. In addition, the valve 22 and line 23 provide for a gas manifold whereby the gases can be purged prior to introduction into the reaction zone. Moreover, if desired, additional carrier gas flow through the reaction zone can be maintained by means of an additional carrier gas feed line 24. Valve 25 controls the flow of carrier gas in line 24.

The nitrogen compound can be any nitrogen-containing compound provided it is capable of providing gaseous nitrogen which is reactive with the other gaseous materials under the conditions present in the reaction zone. Mixtures of nitrogen compound can be used when desired. Examples of suitable nitrogen compounds include ammonia, primary amines, secondary amines, and hydrazine. The preferred nitrogen compound is ammonia.

The silicon compound can be any silicon-containing compound capable of providing gaseous silicon which is reactive with the other gaseous materials under the conditions present in the reaction zone. Mixtures of silicon compounds can be employed when desired.

Examples of some suitable silicon compounds include silane ($SiH_4$), silicon halides such as chlorosilane, dichlorosilane, trichlorosilane, silicon tetrachloride, silicon hexabromide, and silicon hexachloride.

The preferred silicon compound is silane. The ratio of the volume of carrier gas to the total volume of aluminum compound, nitrogen compound, and silicon compound in the reaction zone is from about 10:1 to about 100:1. In addition, the linear gas stream velocity of the carrier gas and reactive gases in the reaction zone is generally between about 5 and about 75 cm/sec. The relative amounts of the aluminum compound, nitrogen compound, and silicon compound are selected to provide the desired relative amounts of Al, N, and Si atoms in the deposited layer, and can be readily ascertained by persons skilled in the art after being aware of the present specification without undue experimentation.

Table I below sets forth a few examples of relative flow rates between $AlCl_3$ and $SiH_4$ and other reaction conditions which can be followed to produce layers of the type disclosed herein.

Table I*

| Approximate Composition of Deposited Layer | | | |
|---|---|---|---|
| | Al | Si | N |
| (1) | 6 | 38.0 | 56.0 |
| (2) | 14 | 30.5 | 55.5 |
| (3) | 27 | 20.0 | 53.0 |

| | Flow rate of $N_2$ through $AlCl_3$ source (cm/min) | Flow rate 1% $SiH_4$ (cc/min) | Ratio $SiH_4/AlCl_3$ | Flow rate $NH_3$ (cc/min) | Flow rate $N_2$ carrier gas (liter/min.) |
|---|---|---|---|---|---|
| (1) | 255 | 800 | 3.2 | 600 | 14 |
| (2) | 255 | 600 | 2.4 | 600 | 14 |
| (3) | 255 | 235 | 0.95 | 600 | 14 |

*The temperature of the substrate is about 900°C.
The vaporization temperature of $AlCl_3$ is about 130°C.

The layers deposited are believed to be obtained by the following equilibrium reactions using ammonia, silane, and aluminum chloride as exemplary reactants.

$$3SiH_4 + 4NH_3 \rightleftharpoons Si_3N_4 + 12H_2 \qquad (1)$$

$$AlCl_3 + NH_3 \rightleftharpoons AlN + 3HCl \qquad (2)$$

The temperature of the substrate in the reaction zone during the deposition of the layer is in the range of about 500° to about 1300° C and preferably in the range of about 700° to about 1000° C.

The layers prepared according to the present invention should contain from 50 to about 57 atomic percent of N, from about 5 to about 30 atomic percent of Al, and from about 20 to about 40 atomic percent of Si. The atomic percents of N, Al, and Si are based upon the total atoms of N, Al, and Si in the layer. In addition, the layer can include other atoms in amounts which do not adversely affect the layer to an undesired extent such as impurity levels. It is preferred however that the layers are substantially, if not entirely, composed of aluminum, nitrogen, and silicon.

The relative thickness of the deposited layer can vary over a wide range and is dependent primarily upon the final use of the device and upon practical and economical considerations. Of particular interest are those layers which are from about 50 to about 1,000 angstroms thick.

After the layer is deposited, its thickness and index of refraction can be measured by using ellipsometry as described by F. McCrackin et al, Journal Research of the National Bureau of Standards, Academy of Physics and Chemistry, 67A[4] 363 (1963).

Figure 2:
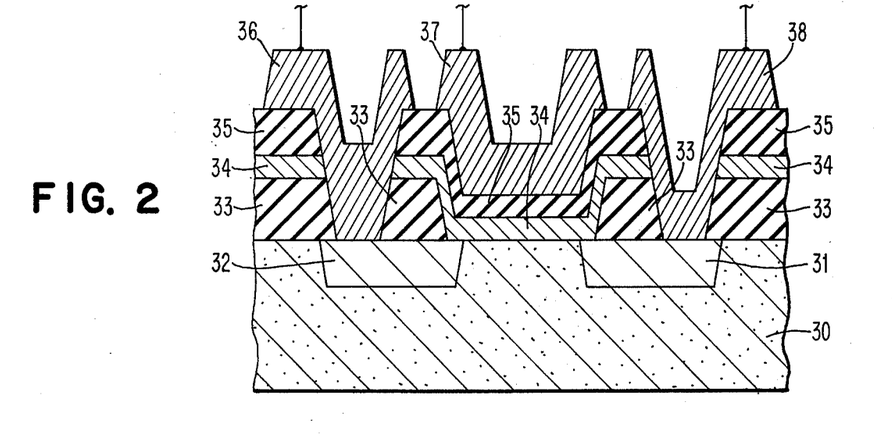
FIG. 2 is a schematic diagram of a MIOSFET device prepared according to the process of the present invention.

FIG. 2 is a schematic representation of a MIOSFET device which can be prepared utilizing the process of the present invention. Numeral 30 in FIG. 2 represents the substrate which in the preferred embodiment is a silicon substrate containing an impurity of a first type. Numerals 31 and 32 represent selected regions containing impurities of a second type. Numeral 33 represents insulating oxide layer such as silicon oxide layer which can be provided on the silicon substrate by oxidation of the silicon substrate to the desired predetermined depth. In the particular embodiment shown, the silicon oxide layer can be from about 25 to about 50 angstroms. Numeral 34 represents the layer or film containing the Al, N, and Si to provide a charge storage layer. Numeral 35 represents an insulating layer such as $Al_2O_3$ or $Si_3N_4$ which in the instant situation is desirably between about 300 and about 600 angstroms. Numerals 36, 37, and 38 represent the source, gate, and drain electrodes, respectively. It is noted that the source and drain electrodes are in ohmic electrical contact with the substrate.

Figure 3:
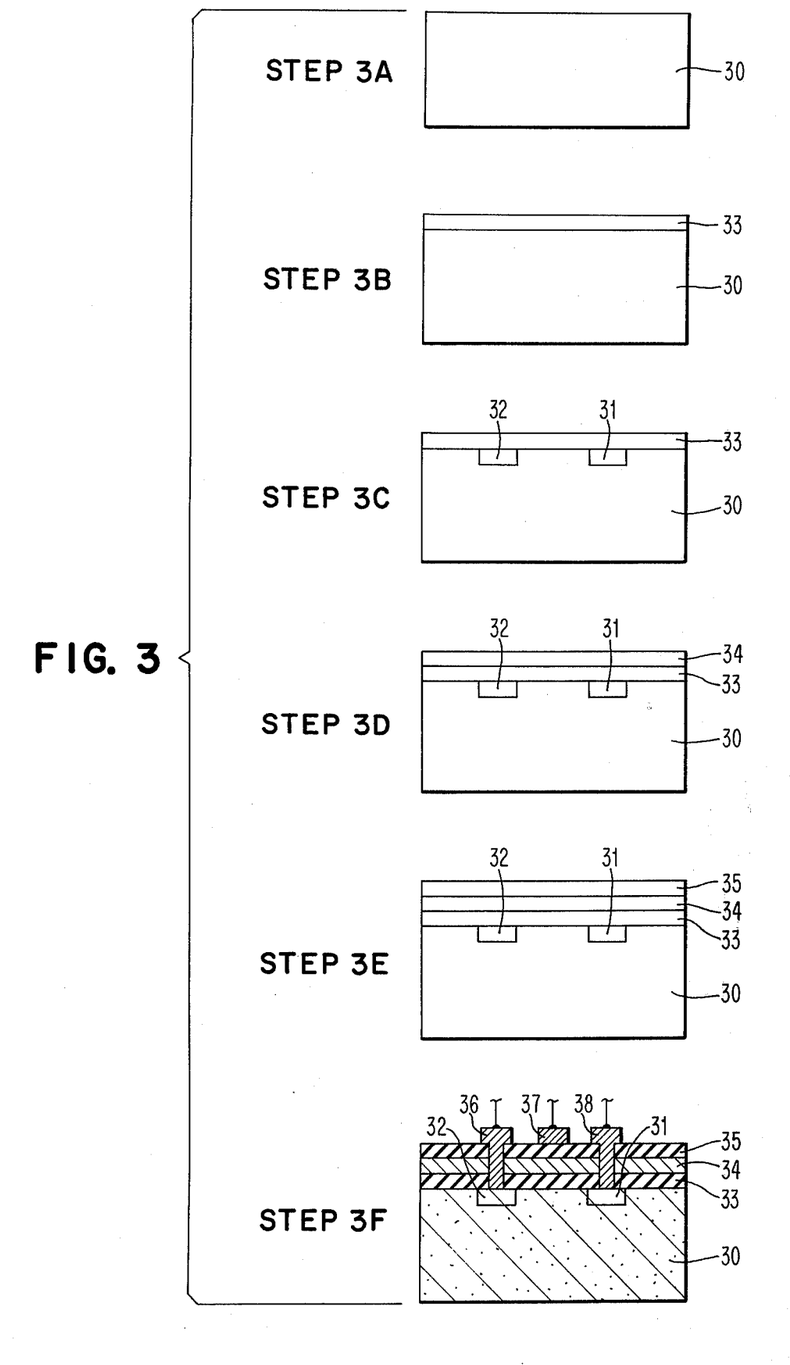
FIG. 3 is a schematic diagram of a sequence of process steps suitable for preparing a semiconductor device.

Reference to FIG. 3 illustrates one sequence of steps which can be employed to prepare MIOSFET devices which utilize the particular aspects of the present invention. Step 3a in FIG. 3 represents providing a semiconductor substrate of a first conductive type which can be provided by methods well known in the art for providing semiconductor substrates. For instance, the methods described in U.S. Pat. Nos. 3,655,457 and 3,770,516 to Duffy et al for the preparation of the substrate or applicable herein. One particular type of substrate which can be employed is a silicon substrate of P-type conductivity or N-type conductivity preferably having a resistivity of about 0.5 to about 5 ohms-centimeters. Next the substrate is provided with a layer of an oxide to provide for gate dielectric for FET applications. In the case of employing a silicon semiconductor substrate, it is preferable to utilize silicon dioxide layer which can be provided on the substrate by thermal oxidation of the substrate to a predetermined depth to provide the desired thickness of the oxide.

Next, the active impurity of a second type can be introduced into preselected regions of the substrate by any of the methods well known in the art as shown by step 3c. Such methods include ion implantation and thermal diffusion. A more complete discussion of ion implantation can be found in U.S. Pat. Nos. 3,655,457 and 3,770,516 to Duffy et al. Next, the layer containing the Al, N, and Si is deposited on top of the oxide layer shown in 3d by the above-described high temperature chemical vapor deposition process. The following step 3e is directed to providing a low conductivity insulating layer of $Al_2O_3$ or $Si_3N_4$ on top of the layer containing the Al, N, and Si by methods well known in the art such as chemical vapor deposition and the like.

The next step shown in FIG. 3 is the etching or developing by removal of selected areas of the oxide layer 33, the layer containing the Al, N, and Si 34, and the insulating layer 35 to provide for ohmic electrical contact between subsequently applied metal electrical contacts and the substrate. Step 3f illustrates the deposition of a plurality of electrodes at preselected locations whereby a predetermined number are in ohmic electrical contact with preselected regions of the substrate to provide the semiconductor device.

It is understood that LSI (large scale integration) devices can be made by the present process by following steps defined herein and by providing a plurality, for instance, of sources, drains, and gates for MIOSFETs.

In addition, it is understood that various of the steps can be interchanged so long as the final product is obtained. For instance, the incorporation of the doping impurity of the second type could be provided in the preselected regions of the substrate after the layer 34 or 35 is deposited rather than in step 3c as shown. Likewise, after each layer is deposited, the preselected portion could be etched away rather than after all three different layers have deposited before etching them all away. In addition, it is noted that it may be possible to etch away all three layers using one etching solution or if necessary different etching solutions can be used when required.

The removal of the materials involves methods well known in the art and such need not be described in great detail in the present application. For instance, a photoresist or electron beam sensitive composition can be applied to the layer by conventional coating techniques such as spraying, dipping, spinning and the like. The article is then exposed to the desired pattern and developed by known techniques such as ultraviolet light, electron beam, or x-ray beam techniques followed by removal of the exposed portions in the case of positive resist materials and unexposed portions in the case of negative resist materials by etching or dissolution in an appropriate liquid. After this, the oxide layers in the unprotected regions are removed by etching in a suitable composition which does not affect the coating but removes the oxide layers. Exemplary of suitable etching solutions include aqueous solutions of buffered hydrofluoric acid.

Semiconductor devices of the type shown in FIG. 2, made in accordance with the present invention, are compared to devices employing layers outside the scope of the present invention. The following Table II sets forth the electrical write-erase data observed in such comparison.

memory window than is observed with the use of $Si_3N_4$ or $Al_2O_3$ for charge storage. On the other hand, increasing the thickness of the underlying oxide layer in devices with $Si_3N_4$ or $Al_2O_3$ layers necessitates the use of excessively high writing voltages that cause early multiple cycling device failure.

What is claimed is:

1. A method for depositing a layer containing Al, N, and Si on a substrate by chemical vapor deposition which comprises:
   A. providing in a reaction zone, a substrate to be coated, a carrier gas, and a reactive gaseous mixture of:
      1. nitrogen compound capable of providing reactive gaseous nitrogen at the conditions in said reaction zone;
      2. aluminum compound capable of providing reactive gaseous aluminum at the conditions in said reaction zone; and
      3. a silicon compound capable of providing reactive gaseous silicon at the conditions in said reaction zone;

Table II

Comparative Electrical Write-Erase Data for Layers of Al, N, and Si Versus Layers of Si and N or Si, N, and O, or Al and O

| Structure | Write Voltage (volts-pulse width in sec.) | Memory Voltage Shift With Writing | Erase Voltage (volts-pulse width in sec.) | Memory Voltage Shift With Erasing | Voltage Window (Write-Erase) | |
|---|---|---|---|---|---|---|
| 25A $SiO_2$ plus 500A $Si_3N_4$ (n=2.0)* | +25V 100 μsec | +4.0 | −25V 100 μsec | −2.5 | +4.0 | +1.5 |
| 35A $SiO_2$ plus 375A $Al_xSi_yN_z$ plus 250A $Al_2O_3$ (x=0.05; y=0.39; z=0.56) | +25V 1 millisec. | +8V | −25V 1 millisec. | −9V | +8.0 | −1.0 |
| 40A $SiO_2$ plus 380A $Al_xSi_yN_z$ plus 250A $Al_2O_3$ (x=0.27; y=0.2; z=0.53) | +20V 1 millisec. | +8V | −20V 1 millisec. | −6V | +8.0 | +2.0 |
| 25A $SiO_2$ plus 500A $Si_3N_{3.6}O_{0.4}$ (n=1.9)* | +25V 100 μsec. | +2.5 | −25V 100μsec. | −1.5 | +2.5 | +1.0 |
| 25A $SiO_2$ plus 500A $Si_3N_2O_2$ (n=1.66)* | +25V 100 μsec. | +1.7 | −25V 100 μsec. | −1.0 | +1.7 | +0.7 |
| 29A $SiO_2$ plus 550A $Al_2O_3$ | (1) +20V 100μsec. (2) +30V 5 millisec. | +7.7 +14.0 | −25V 400 μsec. −30V 5 millisec. | 0 −5.0 | +7.7 +14.0 | +7.7 +9.0 |

*n is the optical index of refraction.

It has been observed that the use of layers of Al, N, and Si in accordance with the present invention provides devices which are easier to write, and therefore, much thicker oxide underlayers can be employed as compared to the use of $Si_3N_4$ or $Al_2O_3$ layers while using the same or lower charge. The ability to employ a thicker oxide underlayer barrier film makes it possible to provide devices of improved charge storage properties exhibiting several decades of time delay in initiation of charge loss and reduction in rate of charge loss. The net result of this is a much smaller loss in B. heating the substrate in said reaction zone to a temperature in the range of about 500° to about 1300° C to cause formation on said substrate of the layer containing Al, N, and Si wherein the atomic percent of N in said layer is from about 50 to about 57%, the atomic percent of Al is from about 30 to about 5%, and the atomic percent of Si is from about 20 to about 40%, said atomic percents being based upon the total atoms of Al, N, and Si in the layer.

2. The method of claim 1 wherein the ratio of the volume of carrier gas to the total volume of aluminum compound, nitrogen compound, and silicon compound in the reaction zone is from about 10:1 to about 100:1.

3. The method of claim 1 wherein the linear gas stream velocity of the carrier gas and reactive gases in the reaction zone is between about 5 and about 75 cm/second.

4. The method of claim 1 wherein the volume of carrier gas to the total volume of aluminum compound, nitrogen compound, and silicon compound in the reaction zone is from about 10:1 to about 100:1; and the linear gas stream velocity of the carrier gas and reactive gases in the reaction zone is between about 5 and about 75 cm/second.

5. The method of claim 1 wherein the substrate is heated in the reaction zone to a temperature in the range of about 700° to about 1,000° C.

6. The method of claim 1 wherein the layer containing Al, N, and Si is from about 50 to about 1,000 angstroms thick.

7. The method of claim 1 wherein the carrier gas is selected from the group consisting of hydrogen, nitrogen, argon, helium, and mixtures thereof.

8. The method of claim 1 wherein the carrier gas is selected from the group consisting of nitrogen, hydrogen, and mixtures thereof.

9. The method of claim 1 wherein said carrier gas is nitrogen.

10. The method of claim 1 wherein the nitrogen compound is selected from the group consisting of ammonia, primary amines, secondary amines, hydrazine, and mixtures thereof.

11. The method of claim 1 wherein said nitrogen compound is ammonia or hydrazine.

12. The method of claim 1 wherein said nitrogen compound is ammonia.

13. The method of claim 1 wherein said aluminum compound is selected from the group consisting of aluminum halides, aluminum alkoxides, trialkyl aluminum compound, alkyl aluminum halides, dialkyl aluminum halides, and mixtures thereof.

14. The method of claim 1 wherein the aluminum compound is an aluminum halide.

15. The method of claim 1 wherein said aluminum compound is aluminum chloride.

16. The method of claim 1 wherein said silicon compound is selected from the group consisting of silane, silicon halides, and mixtures thereof.

17. The method of claim 1 wherein said silicon compound is silane.

18. The method of claim 1 wherein said nitrogen compound is ammonia, said aluminum compound is aluminum chloride, and said silicon compound is silane.

19. A method for fabricating a semiconductor device which comprises:
 A. providing a semiconductor substrate of a first conductive type containing an active impurity of a first type in a reaction zone; a carrier gas, and a reactive gaseous mixture of:
  1. a nitrogen compound capable of providing reactive gaseous nitrogen at the conditions in said reaction zone;
  2. aluminum compound capable of providing reactive gaseous aluminum at the conditions in said reaction zone; and
  3. a silicon compound capable of providing reactive gaseous silicon at the conditions in said reaction zone;
 B. heating the substrate in said reaction zone to a temperature in the range of about 500° to about 1300° C to thereby cause formation on the substrate of a layer containing Al, N, and Si wherein the atomic percent of N in the layer is from about 50 to about 57%, the atomic percent of Al is from about 30 to about 5%, and the atomic percent of Si is from about 20 to about 40%, the atomic percents being based upon the total atoms of N, Al, and Si in the layer;
 C. incorporating an active impurity of a second type into preselected regions of said substrate;
 D. removing material at preselected locations of the layer to provide for ohmic electrical contact between preselected regions of the underlying semiconductor substrate and subsequently apply electrical contacts; and
 E. then depositing a plurality of electrical contacts at preselected locations wherein a predetermined number of the contacts are in ohmic electrical contact with the preselected regions of the underlying semiconductor substrate so as to provide the semiconductor device.

20. The method of claim 19 wherein an insulating oxide layer is provided on said substrate between said substrate and said layer containing the Al, N, and Si; and a low conductivity insulating layer is provided on top of said layer containing Al, N, and Si; and wherein material is removed at preselected locations of the underlying insulating oxide layer, the layer containing the Al, N, and Si, and the low conductivity insulating layer to provide for ohmic electrical contact between preselected regions of the underlying semiconductor substrate and subsequently applied electrical contacts.

21. The method of claim 20 wherein said semiconductor substrate is silicon, said insulating oxide layer is silicon oxide, and said low conductivity insulating layer is selected from the group consisting of $Al_2O_3$ and $Si_3N_4$.

22. The method of claim 19 wherein the ratio of the volume of carrier gas to the total volume of aluminum compound, nitrogen compound, and silicon compound in the reaction zone is from about 10:1 to about 100:1.

23. The method of claim 19 wherein the linear gas stream velocity of the carrier gas and reactive gases in the reaction zone is between about 5 and about 75 cm/second.

24. The method of claim 19 wherein the volume of carrier gas to the total volume of aluminum compound, nitrogen compound, and silicon compound in the reaction zone is from about 10:1 to about 100:1; and the linear gas stream velocity of the carrier gas and reactive gases in the reaction zone is between about 5 and about 75 cm/second.

25. The method of claim 19 wherein the substrate is heated in the reaction zone to a temperature in the range of about 700° to about 1,000° C.

26. The method of claim 19 wherein the layer containing Al, N, and Si is from about 50 to about 1,000 angstroms thick.

27. The method of claim 19 wherein the carrier gas is selected from the group consisting of hydrogen, nitrogen, argon, helium, and mixtures thereof.

28. The method of claim 19 wherein the carrier gas is selected from the group consisting of nitrogen, hydrogen, and mixtures thereof.

29. The method of claim 19 wherein said carrier gas is nitrogen.

30. The method of claim 19 wherein the nitrogen compound is selected from the group consisting of ammonia, primary amines, secondary amines, hydrazine, and mixtures thereof.

31. The method of claim 19 wherein said nitrogen compound is ammonia or hydrazine.

32. The method of claim 19 wherein said nitrogen compound is ammonia.

33. The method of claim 19 wherein said aluminum compound is selected from the group consisting of aluminum halides, aluminum alkoxides, trialkyl aluminum compound, alkyl aluminum halides, dialkyl aluminum halides, and mixtures thererof.

34. The method of claim 19 wherein the aluminum compound is an aluminum halide.

35. The method of claim 19 wherein said aluminum compound is aluminum chloride.

36. The method of claim 19 wherein said silicon compound is selected from the group consisting of silane, silicon halides, and mixtures thereof.

37. The method of claim 19 wherein said silicon compound is silane.

38. The method of claim 19 wherein said nitrogen compound is ammonia, said aluminum compound is aluminum chloride, and said silicon compound is silane.

* * * * *

UNITED STATES PATENT OFFICE
CERTIFICATE OF CORRECTION

Patent No. 3,974,003     Dated August 10, 1976

Inventor(s) Stanley Zirinsky et al.

It is certified that error appears in the above-identified patent and that said Letters Patent are hereby corrected as shown below:

On the Title Page, Item [73] should read as follows:

-- International Business Machines Corporation(IBM), Armonk, New York --.

Signed and Sealed this

First Day of February 1977

[SEAL]

*Attest:*

RUTH C. MASON
*Attesting Officer*

C. MARSHALL DANN
*Commissioner of Patents and Trademarks*